(12) United States Patent
Zhang

(10) Patent No.: US 12,562,341 B2
(45) Date of Patent: Feb. 24, 2026

(54) BASE BIAS ADJUSTMENT APPARATUS AND METHOD, AND SEMICONDUCTOR PROCESS DEVICE

(71) Applicant: BEIJING NAURA MICROELECTRONICS EQUIPMENT CO., LTD., Beijing (CN)

(72) Inventor: Chao Zhang, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 98 days.

(21) Appl. No.: 18/572,172

(22) PCT Filed: Jul. 20, 2022

(86) PCT No.: PCT/CN2022/106654
§ 371 (c)(1),
(2) Date: Dec. 19, 2023

(87) PCT Pub. No.: WO2023/005755
PCT Pub. Date: Feb. 2, 2023

(65) Prior Publication Data
US 2024/0282553 A1 Aug. 22, 2024

(30) Foreign Application Priority Data
Jul. 27, 2021 (CN) .......................... 202110849800.0

(51) Int. Cl.
H01J 37/32 (2006.01)
H03H 7/38 (2006.01)
H03H 7/40 (2006.01)

(52) U.S. Cl.
CPC ....... *H01J 37/32183* (2013.01); *H03H 7/383* (2013.01); *H03H 7/40* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 8,366,833 B2 * | 2/2013 | Makino | H01L 21/67069 |
| | | | 118/728 |
| 2004/0226509 A1 * | 11/2004 | Hori | C23C 14/0694 |
| | | | 118/715 |
| 2021/0050176 A1 * | 2/2021 | Wang | H01J 37/065 |

FOREIGN PATENT DOCUMENTS

| | | |
|---|---|---|
| CN | 101083397 A | 12/2007 |
| CN | 106702335 A | 5/2017 |

(Continued)

OTHER PUBLICATIONS

The World Intellectual Property Organization (WIPO) International Search Report for PCT/CN2022/106654 Oct. 20, 2022 5 Pages.

*Primary Examiner* — Alexander H Taningco
(74) *Attorney, Agent, or Firm* — Anova Law Group, PLLC

(57) ABSTRACT

A base bias adjustment apparatus includes: a positive bias adjustment unit; a negative bias adjustment unit; and an anti-interference unit. A first terminal of the positive bias adjustment unit is grounded, and a second terminal of the positive bias adjustment unit is electrically connected to a base for adjusting a bias voltage of the base to have a positive bias voltage at the base. A first terminal of the negative bias adjustment unit is grounded, and a second terminal of the negative bias adjustment unit is electrically connected to the base through the anti-interference unit for adjusting the bias voltage of the base to have a negative bias (Continued)

voltage at the base. The anti-interference unit is electrically connected between the negative bias adjustment unit and the base for suppressing a current from a circuit between the positive bias adjustment unit and the base.

11 Claims, 5 Drawing Sheets

(56) References Cited

FOREIGN PATENT DOCUMENTS

| | | | | |
|----|------------|----|----|---------|
| CN | 107230981 | A | | 10/2017 |
| CN | 107464764 | A | | 12/2017 |
| CN | 109119317 | A | | 1/2019 |
| CN | 109797371 | A | * | 5/2019 |
| CN | 112259491 | A | | 1/2021 |
| CN | 113604788 | A | | 11/2021 |
| JP | 2015133291 | A | | 7/2015 |
| TW | I276695 | B | | 3/2007 |
| TW | I704592 | B | | 9/2020 |
| WO | 2015196609 | A1 | | 12/2015 |
| WO | 2017152477 | A1 | | 9/2017 |

* cited by examiner

1

BASE BIAS ADJUSTMENT APPARATUS AND METHOD, AND SEMICONDUCTOR PROCESS DEVICE

CROSS-REFERENCE TO RELATED APPLICATIONS

This application is a national phase entry of PCT Patent Application No. PCT/CN2022/106654, filed on Jul. 20, 2022, which claims the priority of Chinese Patent Application No. 202110849800.0, filed on Jul. 27, 2021, the entire contents of all of which are incorporated herein by reference.

TECHNICAL FIELD

The present disclosure relates to the technical field of semiconductor technologies and, more particularly, to a base bias adjustment apparatus and method, and a semiconductor process device.

BACKGROUND

Plasma is widely used in the production process of semiconductor devices. In a plasma etching or deposition system, a radio frequency (RF) power source is used to excite process gases in a reaction chamber to generate plasma. Plasma contains a large number of active particles such as electrons, ions, excited atoms, molecules, and free radicals. These active particles interact with a wafer that is placed in the reaction chamber and is exposed to a plasma environment, causing various physical and chemical reactions on a wafer surface to complete wafer etching or other processes.

Because electrons are lighter than positive ions, more electrons fall on the wafer surface than the positive ions in the same period of time, thus forming a negative direct current (DC) bias voltage on the wafer surface. This negative DC bias voltage will attract positively charged ions and active reactive groups in the plasma to accelerate toward the wafer surface and bombard the wafer surface to achieve the desired process results. A value of the DC bias voltage affects bombardment energy of the positive ions, which in turn affects certain process parameters (such as etching rate, deposition rate, etc.) Currently, in most plasma devices, a lower electrode RF power supply is used to load an RF excitation signal to a base to increase the negative DC bias voltage on the wafer and correspondingly increase ion energy.

FIG. 1 is a structural diagram of a physical vapor deposition (hereinafter referred to as PVD) device. As shown in FIG. 1, the PVD device includes a reaction chamber 01, and a target 02 provided on the top of the reaction chamber 01. The target 02 is electrically connected to a radio frequency (RF) power supply and a direct current (DC) power supply (neither shown). The target 02 is located inside the reaction chamber 01. A base 03 for carrying a wafer 04 is provided below the target 02 in the reaction chamber 01. The base 03 is electrically connected to the RF power supply 05 through a matcher 06. The RF power supply 05 is used to load the negative bias voltage to the base 03. By changing an RF power output of the RF power supply 05, a bias voltage of the base 03 can be adjusted, thereby controlling parameters such as a deposition rate and film stress.

However, because the RF power supply 05 only loads the negative bias voltage to the base 03, it may damage the wafer in some processes, resulting in a high wafer voltage forward (VF) value and a disqualified process result. Moreover, a process window of the PVD device is small and cannot meet different process needs.

SUMMARY

The present invention aims to solve at least one of the technical problems existing in the prior art, and provides a base bias adjustment apparatus and method, and a semiconductor process device, which can meet different process requirements, thereby expanding a process window.

One aspect of the present disclosure provides a base bias adjustment apparatus. The base bias adjustment apparatus includes: a positive bias adjustment unit; a negative bias adjustment unit; and an anti-interference unit. Aa first terminal of the positive bias adjustment unit is grounded, and a second terminal of the positive bias adjustment unit is electrically connected to a base for adjusting a bias voltage of the base to have a positive bias voltage at the base. A first terminal of the negative bias adjustment unit is grounded, and a second terminal of the negative bias adjustment unit is electrically connected to the base through the anti-interference unit for adjusting the bias voltage of the base to have a negative bias voltage at the base. The anti-interference unit is electrically connected between the negative bias adjustment unit and the base for suppressing a current from a circuit between the positive bias adjustment unit and the base from flowing into a circuit between the negative bias adjustment unit and the base, thereby facilitating simultaneous operation of the positive bias adjustment unit and the negative bias adjustment unit in a process.

In some embodiments, the positive bias adjustment unit includes an impedance variable circuit. One terminal of the impedance variable circuit is electrically connected to the base, and the other terminal of the impedance variable circuit is grounded. The impedance variable circuit is used to adjust the bias voltage of the base by adjusting an impedance of the impedance variable circuit.

In some embodiments, the impedance variable circuit includes at least one first variable capacitor, at least one variable inductor, or at least one first variable capacitor and at least one variable inductor that are electrically connected, an electrical connection between the at least one first variable capacitor and the at least one variable inductor including a parallel connection, a series connection, or a mixed connection.

In some embodiments, the anti-interference unit includes a band stop filter or a digital filter.

In some embodiments, the negative bias adjustment unit includes a radio frequency (RF) power supply and a matching circuit between the RF power supply and the base.

In some embodiments, the matching circuit includes a first branch and a second branch, wherein one terminal of the first branch is electrically connected to an output terminal of the RF power supply, the other terminal of the first branch is grounded, and the first branch includes a second variable capacitor. Two terminals of the second branch are electrically connected to the output terminal of the RF power supply and the base respectively, the second branch includes a third variable capacitor, and the anti-interference unit is electrically connected to the second branch.

In some embodiments, the matching circuit includes a first branch, a second branch, a third branch, and a fourth branch, wherein one terminal of the first branch is electrically connected to an output terminal of the RF power supply, the other terminal of the first branch is grounded, and the first branch includes a second variable capacitor. Two terminals of the second branch are electrically connected to the output terminal of the RF power supply and one terminal of the fourth branch respectively, and the second branch includes a fixed capacitor. One terminal of the third branch is electrically connected to the one terminal of the fourth branch, the other terminal of the third branch is grounded, and the third branch includes a third variable capacitor. The other terminal of the fourth branch is electrically connected to the base through the anti-interference unit.

In some embodiments, the base bias adjustment apparatus further includes a parameter acquisition unit and a control unit. The parameter acquisition unit is used to acquire a current parameter value related to an impedance of the positive bias adjustment unit in real time, and send it to the control unit. According to the current parameter value and a preset parameter value, the control unit is used to control the positive bias adjustment unit to adjust a bias voltage of the base until the current parameter value is equal to the preset parameter value.

In some embodiments, the parameter acquisition unit includes a voltage detection unit for detecting a current bias voltage of the base in real time and sending it to the control unit. According to the current bias voltage and a preset bias voltage, the control unit is used to control the positive bias adjustment unit to adjust the bias voltage of the base until the current bias voltage is equal to the preset bias voltage.

In some embodiments, the parameter acquisition unit includes an impedance detection unit for detecting an input voltage and an input current of the positive bias adjustment unit in real time and sending it to the control unit. According to the input voltage and input current, the control unit is used to calculate an input impedance, and according to the input impedance and a preset impedance, the control unit is used to control the positive bias adjustment unit to adjust the bias voltage of the base until the input impedance is equal to the preset impedance.

Another aspect of the present disclosure provides a semiconductor process device. The semiconductor process device includes a reaction chamber, a base provided in the reaction chamber, and a target provided on top of the reaction chamber. The semiconductor process device further includes the disclosed base bias adjustment apparatus, and the base bias adjustment apparatus is electrically connected to the base to adjust a bias voltage of the base.

Another aspect of the present disclosure provides a base bias adjustment method being applied to the disclosed base bias adjustment apparatus. The method includes: at S1, during a process, obtaining the current parameter value related to the impedance of the positive bias adjustment unit; at S2, determining whether the current parameter value is equal to the preset parameter value, if equal, proceeding to S1, and if not equal, proceeding to S3; at S3, controlling the positive bias adjustment unit to adjust the bias voltage of the base until the current bias voltage is equal to the preset parameter value, and proceeding to S1.

In some embodiments, the positive bias adjustment unit includes the impedance variable circuit; the one terminal of the impedance variable circuit is electrically connected to the base, and the other terminal of the impedance variable circuit is grounded; the impedance variable circuit is used to adjust the bias voltage of the base by adjusting the impedance of the impedance variable circuit; the impedance variable circuit includes the at least one first variable capacitor, the at least one variable inductor, or the at least one first variable capacitor and the at least one variable inductor that are electrically connected. S3 includes: at S31, driving a moving piece of the first variable capacitor to rotate in a first direction by a unit change amount; at S32, determining whether the current parameter value is equal to the preset parameter value; if equal, proceeding to S1; if not equal, proceeding to S33; at S33, determining whether a distance between a current position and an initial position of the moving piece of the first variable capacitor exceeds a preset threshold; if yes, proceeding to S34; if no, proceeding to S31; at S34, driving the moving piece of the first variable capacitor to rotate in a second direction by the unit change amount, the second direction being opposite to the first direction; at S35, determining whether the current parameter value is equal to the preset parameter value; if equal, proceeding to S1; if not equal, proceeding to S36; at S36, determining whether the distance between the current position and the initial position of the moving piece of the first variable capacitor exceeds the preset threshold; if yes, proceeding to S37; if no, proceeding to S34; and at S37, sending an alarm signal and exiting.

The invention has the following beneficial effects.

In the technical solutions of the base bias adjustment apparatus and method and the semiconductor process device provided by the present disclosure, the second terminal of the positive bias adjustment unit is electrically connected to the base, and the second terminal of the negative bias adjustment unit is electrically connected to the base through the anti-interference unit. By using the anti-interference unit to suppress the current from the circuit between the positive bias adjustment unit and the base from flowing into the circuit between the negative bias adjustment unit and the base, the positive bias adjustment unit and the negative bias adjustment unit always maintain electrical conduction with the base at the same time. At the same time, the base bias adjustment by the positive bias adjustment unit will not be affected by the negative bias adjustment unit. That is, the positive bias adjustment unit and the negative bias adjustment unit are used simultaneously during the process, and mutual interference between the two is avoided. At the same time, because the positive bias adjustment unit can cause the base to have a positive bias and the negative bias adjustment unit can cause the base to have a negative bias, the simultaneous use of the two can make the adjustment range of the base bias voltage larger, thereby expanding the process window to meet different process requirements.

DETAILED DESCRIPTION OF THE EMBODIMENTS

To enable those skilled in the art to better comprehend the technical solution of the present disclosure, a base bias adjustment apparatus and method, and a semiconductor process device provided by the present disclosure will be described in detail below with reference to the accompanying drawings.

First Embodiment

Figure 1:
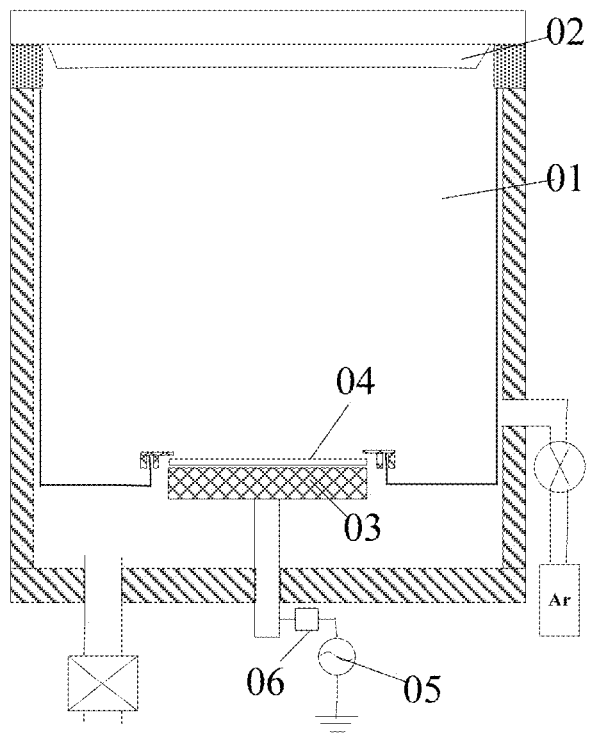
FIG. 1 is a structural diagram of a PVD device.
Figure 2:
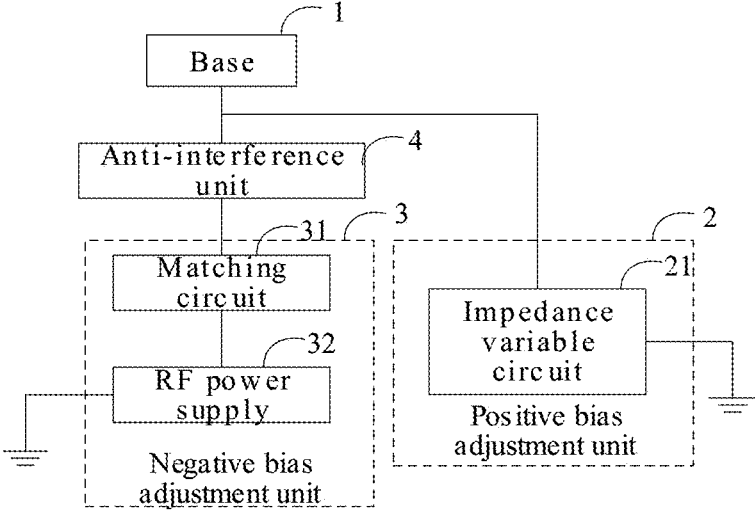
FIG. 2 is a functional block diagram of an exemplary base bias adjustment device according to some embodiments of the present disclosure.

FIG. 2 is a functional block diagram of an exemplary base bias adjustment device according to some embodiments of the present disclosure. As shown in FIG. 2, the base bias adjustment apparatus includes a positive bias adjustment unit 2, a negative bias adjustment unit 3, and an anti-interference unit 4. A first terminal of the positive bias adjustment unit 2 is grounded, and a second terminal of the positive bias adjustment unit 2 is directly connected to a base 1. Being directly connected refers to that only electrical wires are connected for electrical conduction between the positive bias adjustment unit 2 and the base 1, and no switching devices or other devices are arranged between them. Thus, during a process, the positive bias voltage adjustment unit 2 and the base 1 are directly electrically connected. The positive bias adjustment unit 2 is used to adjust a bias voltage of the base 1 and is able to apply a positive bias voltage to the base 1. A first terminal of the negative bias adjustment unit 3 is grounded, and a second terminal of the negative bias adjustment unit 3 is connected to the base 1 through the anti-interference unit 4. The negative bias adjustment unit 3 is used to adjust the bias voltage of the base 1 and is able to apply a negative bias voltage to the base 1. The anti-interference unit 4 is connected to a circuit between the negative bias adjustment unit 3 and the base 1, and is used to suppress a current in a circuit between the positive bias adjustment unit 2 and the base 1 from flowing into the circuit between the negative bias adjustment unit 3 and the base 1. That is, during the process, the circuit between the positive bias voltage adjustment unit 2 and base 1 and the circuit between the negative bias voltage adjustment unit 3 and the base 1 are directly electrically connected, and both the positive bias voltage adjustment unit 2 and the negative bias voltage adjustment unit 3 are able to simultaneously adjust the bias voltage of the base 1. At the same time, with the help of the anti-interference unit 4, it can be ensured that the current from the circuit between the positive bias voltage adjustment unit 2 and the base 1 will not flow into the circuit between the negative bias voltage adjustment unit 3 and the base 1.

Specifically, as shown in FIG. 2, the circuit between the negative bias adjustment unit 3 and the base 1 is connected in parallel with the circuit between the positive bias adjustment unit 2 and the base 1. The current from the base 1 will be shunted to the two circuits, affecting bias voltage adjustment of the base 1 through the positive bias voltage adjustment unit 2. For example, a desired bias value cannot be accurately adjusted. In this case, by connecting the anti-interference unit 4 to the circuit between the negative bias adjustment unit 3 and the base 1, the current from the circuit between the positive bias adjustment unit 2 and the base 1 is suppressed from flowing into the circuit between the negative bias adjustment unit 3 and the base 1. Current shunting from the base 1 can be avoided. Thus, the bias voltage adjustment of the base 1 through the positive bias adjustment unit 2 will not be affected by the negative bias adjustment unit 3. The positive bias adjustment unit 2 and the negative bias adjustment unit 3 can be used simultaneously during the process. Adjustment range of a base bias voltage can be increased through simultaneous operation of both the positive bias adjustment unit 2 and the negative bias adjustment unit 3, thereby expanding a process window to meet various process requirements.

It should be noted that if the positive bias adjustment unit 2 and the negative bias adjustment unit 3 are used at the same time, a bias value (i.e., bias voltage) of the base 1 is a sum of a preset positive bias value and a preset negative bias value. If the preset positive bias value is greater than the preset negative bias value, then an adjusted bias value of the base 1 is positive. If the preset positive bias value is less than the preset negative bias value, then the adjusted bias value of the base 1 is negative. In addition, if the positive bias voltage adjustment unit 2 is used alone, the adjusted bias value of the base 1 is positive. If the negative bias voltage adjustment unit 3 is used alone, the adjusted bias value of the base 1 is negative. In practical applications, whether to use the positive bias adjustment unit 2 alone, the negative bias adjustment unit 3 alone, or both the positive bias adjustment unit 2 and the negative bias adjustment unit 3 at the same time, whether the bias value of the base 1 is positive or negative, and whether the adjusted bias value of the base 1 is the preset positive bias value and/or the preset negative bias value can be determined according to actual needs. It should be noted that independent use (i.e., independent operation) refers to independently adjusting the bias value of the base 1 by only one of the positive bias adjustment unit 2 and the negative bias adjustment unit 3. However, both the positive bias adjustment unit 2 and the negative bias adjustment unit 3 always maintain electrical conduction with the base 1.

It should also be noted that the use of the positive bias adjustment unit alone or the negative bias adjustment unit alone refers to using the positive bias adjustment unit alone or the negative bias adjustment unit alone to adjust the bias voltage of the base. However, the circuit between the positive bias adjustment unit 2 and the base 1 and the circuit between the negative bias adjustment unit 3 and the base 1 are always connected.

By adjusting the bias voltage of the base 1, particle energy and plasma sheath thickness on the wafer surface can be changed when a film is deposited, thereby improving stress and density of the film. At the same time, when a negative bias voltage is applied to the base 1, metal atoms in the plasma bombard the wafer surface with greater energy, resulting in a faster deposition rate. However, in some processes, the wafer may be damaged, resulting in an excessively high wafer VF value. When a positive bias voltage is applied to the base 1, the metal atoms in the plasma bombard the wafer with less energy, resulting in a slower deposition rate. As a result, a negative bias voltage or a positive bias voltage can be selected to be applied to the base according to different process requirements, thereby expanding the process window.

In some embodiments, the anti-interference unit 4 may be a band-stop filter or a digital filter, etc. For example, the anti-interference unit 4 is a band-stop filter. The anti-interference unit 4 includes, for example, a fixed capacitor and a fixed inductor connected in parallel. By connecting the band-stop filter to the circuit between the negative bias adjustment unit 3 and the base 1, it ensures that an impedance of the circuit is infinite when a power output by the negative bias adjustment unit 3 can be normally loaded onto the base 1. Thus, the current from the circuit between the positive bias voltage adjustment unit 2 and the base 1 can be suppressed from flowing into the circuit between the negative bias voltage adjustment unit 3 and the base 1. In practical applications, the anti-interference unit 4 can also adopt other suitable structures, as long as it can suppress the current from the circuit between the positive bias adjustment unit 2 and the base 1 from flowing into the circuit between the negative bias adjustment unit 3 and the base 1.

In some embodiments, the positive bias adjustment unit 2 includes an impedance variable circuit 21. A terminal of the impedance variable circuit 21 is electrically connected to the base 1, and the other terminal of the impedance variable circuit 21 is grounded. The circuit 21 is used to adjust the bias voltage of the base 1 by adjusting an impedance of the variable impedance circuit 21.

Figure 3:
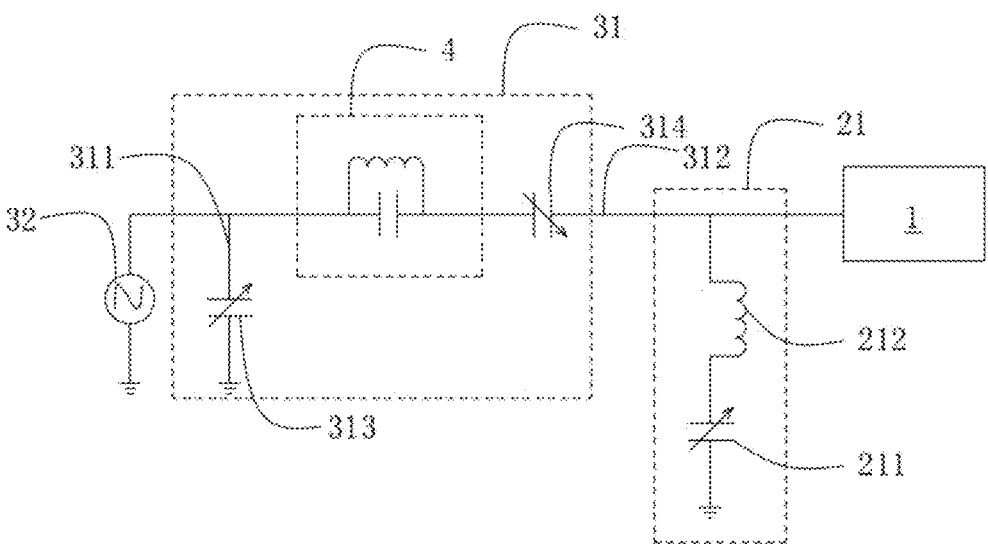
FIG. 3 is an equivalent circuit diagram of an exemplary base bias adjustment device according to some embodiments of the present disclosure.

The impedance variable circuit 21 may include at least one first variable capacitor, or at least one variable inductor, or at least one first variable capacitor and at least one variable inductor that are electrically connected. For example, as shown in FIG. 3, the impedance variable circuit 21 includes a first variable capacitor 211. By adjusting a capacitance value of the first variable capacitor 211, the impedance of the variable impedance circuit 21 can be adjusted, thereby facilitating adjustment of the bias voltage of the base 1.

In addition, according to different process conditions and process requirements, the variable impedance circuit 21 may also include fixed capacitors and/or fixed inductors. For example, as shown in FIG. 3, the impedance variable circuit 21 also includes a fixed inductor 212 that is connected in series to the variable capacitor 211. The fixed inductor 212 and the variable capacitor 211 will produce series resonance, which can adjust a resonant frequency of the base 1 such that it will not be close to a resonant frequency of a system, thereby avoiding undesired resonance.

In some embodiments, the negative bias adjustment unit 3 includes a matching circuit 31 and an RF power supply 32. By adjusting the power of the RF power supply 32, the bias voltage of the base 1 can be adjusted. The RF power supply 32 may have an operating frequency at 13 MHz or 2 MHz.

The matching circuit 31 is used to make an input impedance of an impedance matching network (composed of passive components such as capacitors, inductors, etc. between the RF power supply 32 and the base 1) conjugately match an output impedance of the RF power supply 32, thereby reducing power reflection at a load terminal (base 1) and enabling the base 1 to obtain maximum power, that is, achieving impedance matching.

The impedance matching network adopts, for example, an L-shaped impedance matching network. In this case, as shown in FIG. 3, the matching circuit 31 includes a first branch 311 and a second branch 312. One terminal of the first branch 311 is electrically connected to an output terminal of the RF power supply 32, and the other terminal of the first branch 311 is grounded. The first branch 311 includes a second variable capacitor 313. Both terminals of the second branch 312 are electrically connected to the output terminal of the RF power supply 32 and the base 1, respectively. The second branch 312 includes a third variable capacitor 314. By adjusting capacitance values of the second variable capacitor 313 and the third variable capacitor 314 respectively, the adjusted input impedance of the impedance matching network and the adjusted output impedance of the RF power supply 32 can be conjugately matched, thereby achieving impedance matching.

As shown in FIG. 3, the anti-interference unit 4 is connected to the second branch 312. For example, the anti-interference unit 4 may be disposed on the input terminal of the third variable capacitor 314. In another example, the anti-interference unit 4 is a band-stop filter including a fixed capacitor and a fixed inductor that are connected in parallel. The anti-interference unit 4 makes an impedance of the second branch 312 infinite, such that the current from the base 1 can only flow into the variable impedance circuit 21, but cannot flow into the second branch 312.

Figure 4A:
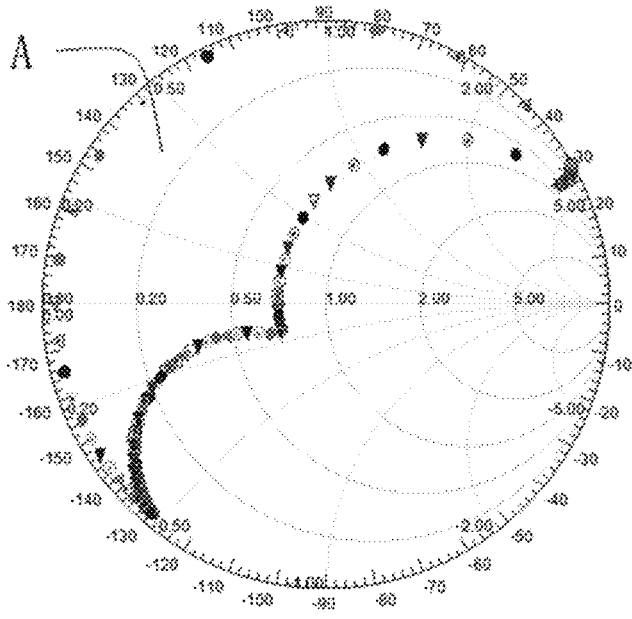
FIG. 4A is a Smith chart showing a matching range of impedance matching of a matching circuit without a positive bias adjustment unit according to some embodiments of the present disclosure.
Figure 4B:
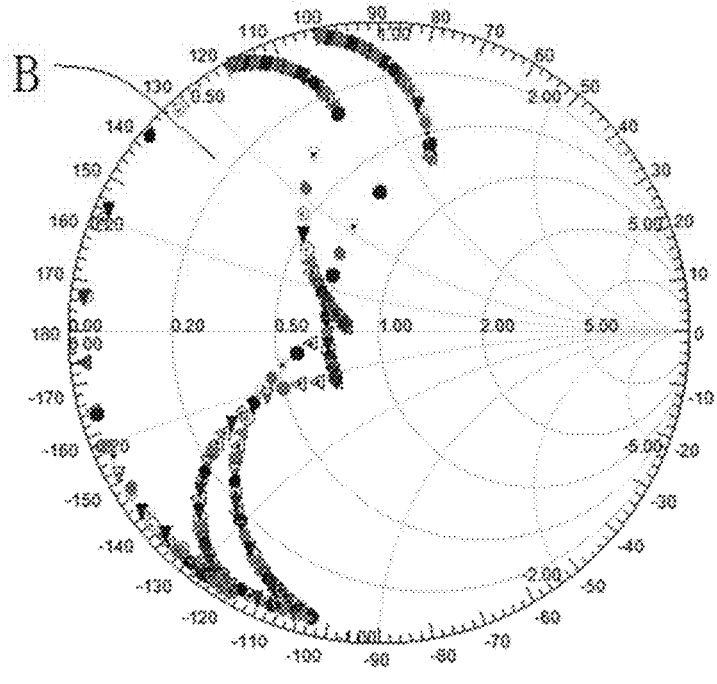
FIG. 4B is a Smith chart showing a matching range of impedance matching of a matching circuit with a positive bias adjustment unit according to some embodiments of the present disclosure.

FIG. 4A is a Smith chart showing a matching range of impedance matching of a matching circuit without a positive bias adjustment unit according to some embodiments of the present disclosure. FIG. 4B is a Smith chart showing a matching range of impedance matching of a matching circuit with a positive bias adjustment unit according to some embodiments of the present disclosure. For example, the matching circuit has an operating frequency at 13 MHz. A range A enclosed by dots in FIG. 4A represents the matching range of impedance matching of the matching circuit without the positive bias adjustment unit. Two ranges B enclosed by dots in FIG. 4B represent the matching range of impedance matching of the matching circuit with the positive bias adjustment unit. The two ranges B respectively correspond to an upper limit and a lower limit of a capacitance value range of the first variable capacitor 211. Comparing FIG. 4A and FIG. 4B, the range A and the two ranges B have a large overlapping area. The positive bias adjustment unit has negligible impact on the matching range of impedance of the matching circuit. Therefore, the positive bias adjustment unit 2 and the negative bias adjustment unit 3 can be used simultaneously during the process, thereby expanding the adjustment range of the base bias voltage to meet different process requirements.

It should be noted that in some embodiments, the impedance matching network adopts an L-shaped impedance matching network. However, the present disclosure is not limited to this. In practical applications, the impedance matching network can adopt any other type, which is not specifically limited by the present disclosure.

Second Embodiment

Figure 5:
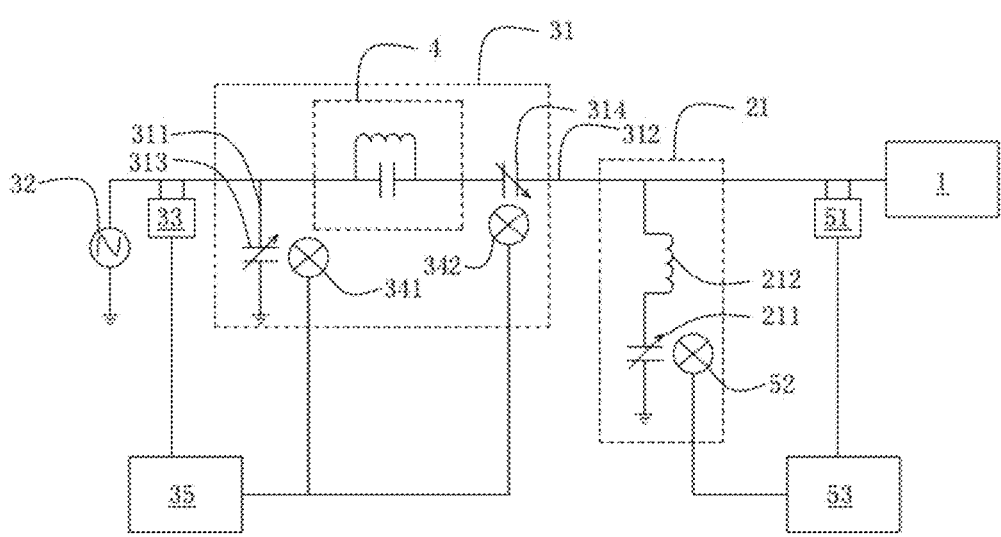
FIG. 5 is an equivalent circuit diagram of another exemplary base bias adjustment device according to some embodiments of the present disclosure.

FIG. 5 is an equivalent circuit diagram of another exemplary base bias adjustment device according to some embodiments of the present disclosure. The base bias adjustment device is an improvement on the base bias adjustment device in the first embodiment. Specifically, the base bias adjustment device further includes a parameter acquisition unit and a control unit 53. The parameter acquisition unit is used to acquire in real time a current parameter value related to an impedance of the positive bias adjustment unit 2, and send it to the control unit 53. For example, the current parameter value related to the impedance is a current bias voltage of the base 1 or an input voltage value and an input current value of the positive bias adjustment unit 2 (from the base 1), etc. The control unit 53 is used to control the positive bias voltage adjustment unit 2 to adjust the bias voltage of the base 1 according to the current parameter value and a preset parameter value, until the current parameter value is equal to the preset parameter value. Thus, the base bias adjustment is automatically controlled.

The preset parameter value can be set in the process configuration in advance. Moreover, if the current parameter value is the current bias voltage of the base 1, then the preset parameter value is the preset bias voltage. If the current parameter value is the input voltage value and the input current value of the positive bias voltage adjustment unit 2, then the preset parameter value is a preset impedance value.

It should be noted that if the negative bias voltage adjustment unit 3 and the positive bias voltage adjustment unit 2 need to be used at the same time during the process, the power output by the RF power supply 32 can also be set in the process configuration in advance, and the power output by the RF power supply 32 can also be adjusted during the process. That is, during the process, the bias voltage of the base 1 can be adjusted by both the negative bias voltage adjustment unit 3 and the positive bias voltage adjustment unit 2 as long as a final bias voltage of the base 1 reaches a target bias voltage that meets the process requirements.

In some embodiments, as shown in FIG. 5, the parameter acquisition unit includes a voltage detection element 51, which is used to detect the current bias voltage of the base 1 in real time and send it to the control unit 53. The control unit 53 is used to control the positive bias adjustment unit 2 to adjust the bias voltage of the base 1 according to the current bias voltage and the preset bias voltage until the current bias voltage is equal to the preset bias voltage. By detecting the current bias voltage of the base 1 in real time through the voltage detection element 51, the bias voltage of the base 1 can be adjusted in real time during the process, such that not only the process requirements can be met, but also process consistency is ensured for different process chambers.

Regarding a specific structure of the positive bias adjustment unit 2 shown in FIG. 5, the control unit 53 can drive a moving piece of the first variable capacitor 211 to rotate through a motor 52 to adjust the capacitance value of the first variable capacitor 211, such that the current in the impedance variable circuit 21 can be changed, and the bias voltage of the base 1 can be adjusted. A control mode of the control unit 53 can be adjusted adaptively according to different structures of the positive bias adjustment unit 2.

It should be noted that impedance matching by the matching circuit 31 is a known process. For example, as shown in FIG. 5, the voltage detection element is used to detect the input voltage value and the input current value at the input terminal of the matching circuit 31 in real time, and the control unit 53 is used to drive the moving pieces of the second variable capacitor 313 and the third variable capacitor 314 to rotate using two motors (341, 342) to adjust the capacitance values of the two capacitors respectively according to the detected input voltage value and the detected input current value, thereby performing impedance matching.

Third Embodiment

Figure 6:
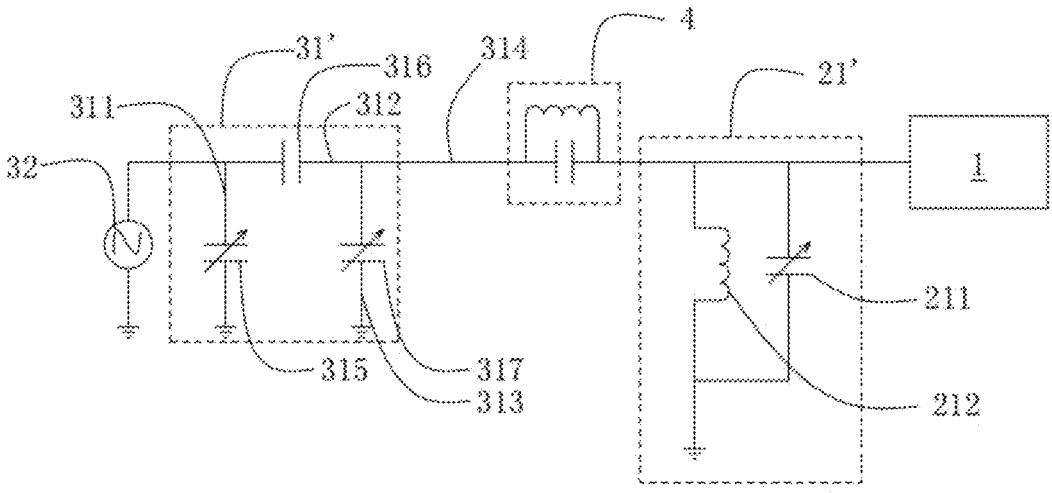
FIG. 6 is an equivalent circuit diagram of another exemplary base bias adjustment device according to some embodiments of the present disclosure.

FIG. 6 is an equivalent circuit diagram of another exemplary base bias adjustment device according to some embodiments of the present disclosure. Compared with the first and second embodiments, the base bias adjustment device in the third embodiment is different in the impedance variable circuit 21', which is different from the impedance variable circuit 21 in the first and second embodiments.

Specifically, the impedance variable circuit 21' also includes the first variable capacitor 211. By adjusting the capacitance value of the first variable capacitor 211, the impedance of the variable impedance circuit 21 can be adjusted, thereby adjusting the bias voltage of the base 1. In addition, fixed capacitors and/or fixed inductors can be configured in the impedance variable circuit 21 according to different process conditions and process requirements. For example, as shown in FIG. 6, the impedance variable circuit 21' also includes a fixed inductor 212 connected in parallel with the first variable capacitor 211. The fixed inductor 212 and the first variable capacitor 211 will produce parallel resonance to adjust the resonant frequency of the base 1.

In some embodiments, as shown in FIG. 6, the impedance matching network adopts a x-type impedance matching network. In this case, the matching circuit 31' includes a first branch 311, a second branch 312, a third branch 313, and a fourth branch 314. One terminal of the first branch 311 is electrically connected to an output terminal of the RF power supply 32, the other terminal of the first branch 311 is grounded, and the first branch 311 includes a second variable capacitor 315. Two terminals of the second branch 312 are electrically connected to the output terminal of the RF power supply 32 and one terminal of the fourth branch 314 respectively, and the second branch 312 includes a fixed capacitor 316. One terminal of the third branch 313 is electrically connected to one terminal of the fourth branch 314, the other terminal of the third branch 313 is grounded, and the third branch 313 includes a third variable capacitor 317. The other terminal of the fourth branch 314 is electrically connected to the base 1 through the anti-interference unit 4. By adjusting the capacitance values of the second variable capacitor 315 and the third variable capacitor 317 respectively, the adjusted input impedance of the impedance matching network and the adjusted output impedance of the RF power supply 32 can be conjugately matched, thereby achieving impedance matching.

As shown in FIG. 6, the anti-interference unit 4 is connected to the fourth branch 314. For example, the anti-interference unit 4 is a band-stop filter including a fixed capacitor and a fixed inductor that are connected in parallel. The anti-interference unit 4 makes the impedance of the fourth branch 314 infinite, such that the current from the base 1 can only flow into the impedance variable circuit 21', but cannot flow into the fourth branch 314.

It should be noted that, in this embodiment, the impedance matching network adopts the x-type impedance matching network. However, the present disclosure is not limited to this. In practical applications, the impedance matching network can adopt any other type, for example, the L-shaped impedance matching network as shown in FIG. 4.

Fourth Embodiment

Figure 7:
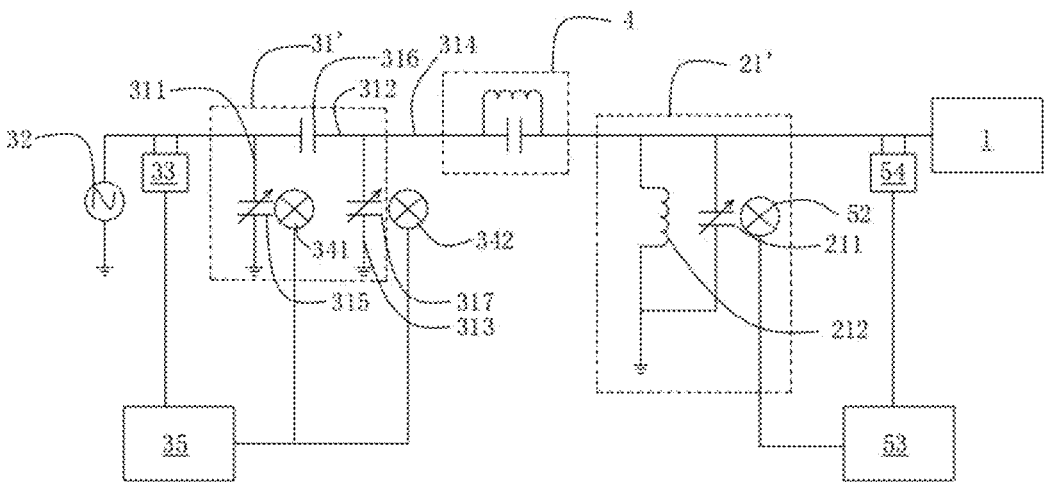
FIG. 7 is an equivalent circuit diagram of another exemplary base bias adjustment device according to some embodiments of the present disclosure.

FIG. 7 is an equivalent circuit diagram of another exemplary base bias adjustment device according to some embodiments of the present disclosure. The base bias adjustment device in the fourth embodiment is similar to the base bias adjustment device in the second embodiment, and also includes a parameter acquisition unit and a control unit 53. The difference is that the parameter acquisition unit includes the voltage detection element 54. The impedance detection element 54 is used to detect the input voltage value and the input current value of the positive bias adjustment unit 2 in real time, and send them to the control unit 53. The control unit 53 is used to calculate the input impedance value according to the input voltage value and the input current value, and controls the positive bias voltage adjustment unit 2 to adjust the bias voltage of the base 1 based on the input impedance value and the preset impedance value until the input impedance value is equal to the preset impedance value. Thus, the base bias adjustment is automatically controlled.

Regarding the specific structure of the positive bias adjustment unit 2 shown in FIG. 7, the control unit 53 drives the moving piece of the first variable capacitor 211 to rotate through the motor 52 to adjust the capacitance value of the first variable capacitor 211, such that the current in the impedance variable circuit 21 can be changed, and the bias voltage of the base 1 can be adjusted.

It should be noted that the impedance detection element 54 shown in FIG. 7 can also be applied to the base bias adjustment device shown in FIG. 5 and can replace the voltage detection element 51. The voltage detection element 51 can also be applied to the base bias adjustment device shown in FIG. 7 and can replace the impedance detection element 54.

As another technical solution, the present disclosure also provides a semiconductor process device. The semiconductor process device includes a reaction chamber, a base provided in the reaction chamber, and a target provided on the top of the reaction chamber. The semiconductor process device further includes a base bias adjustment device, which is electrically connected to the base and is used to adjust the bias voltage of the base. The base bias adjustment device can be the base bias adjustment device provided by the embodiments of the present disclosure.

In the semiconductor process device provided by the embodiments of the present disclosure, by using the base bias adjustment device provided by the above embodiments of the present disclosure, the positive bias adjustment unit and the negative bias adjustment unit can always maintain electrical conduction with the base at the same time. At the same time, it is ensured that the bias adjustment of the base by the positive bias adjustment unit will not be affected by the negative bias adjustment unit, that is, the positive bias adjustment unit and the negative bias adjustment unit can be used simultaneously during the process, and mutual interference between the two can be avoided. At the same time, because the positive bias adjustment unit can cause the base to have a positive bias voltage, and the negative bias adjustment unit can cause the base to have a negative bias voltage, using both at the same time can expand the adjustment range of the base bias voltage, thereby expanding the process window to meet more diverse process requirements.

Fifth Embodiment

Figure 8:
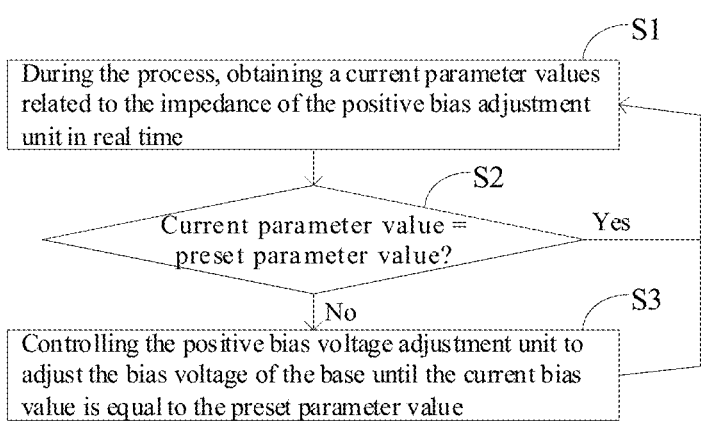
FIG. 8 is a flowchart of an exemplary base bias adjustment method according to some embodiments of the present disclosure.

As another technical solution, the present disclosure also provides a base bias adjustment method. The method can be applied to the base bias adjustment device provided in the second or the fourth embodiment. For example, the base bias adjustment device is as shown in FIG. 5 or FIG. 7. As shown in FIG. 8, the base bias adjustment method includes the following processes.

At S1, during the process, a current parameter values related to the impedance of the positive bias adjustment unit 2 is obtained in real time.

For example, the current parameter value related to the impedance is the current bias voltage of the base 1 or the input voltage value and the input current value of the positive bias voltage adjustment unit 2, etc.

At S2, whether the current parameter value is equal to the preset parameter value is determined. If equal, the method proceeds to S1. If not equal, the method proceeds to S3.

The preset parameter values can be set in the process configuration in advance. Moreover, if the current parameter value is the current bias voltage of the base 1, then the preset parameter value is the preset bias voltage. If the current parameter value is the input voltage value and input current value of the positive bias voltage adjustment unit 2, then the preset parameter value is the preset impedance value.

At S3, the positive bias voltage adjustment unit 2 is controlled to adjust the bias voltage of the base 1 until the current bias value is equal to the preset parameter value, and then the method proceeds to the S1.

In some embodiments, as shown in FIG. 5, for example, the parameter acquisition unit includes the voltage detection element 51. At S1, the current bias voltage of the base 1 is detected in real time through the voltage detection element 51. As described at S2, whether the current bias voltage is equal to the preset bias voltage is determined. If equal, the method proceeds to S1. If not equal, the method proceeds to S3. At S3, according to the current bias voltage and the preset bias voltage, the positive bias voltage adjustment unit 2 is controlled to adjust the bias voltage of the base 1 until the current bias voltage is equal to the preset bias voltage.

At S3, a difference between the current bias voltage and the preset bias voltage is calculated, and the positive bias adjustment unit 2 is controlled according to the difference to adjust the bias voltage of the base 1 until the current bias voltage is equal to the preset bias voltage.

In some embodiments, as shown in FIG. 7, for example, the parameter acquisition unit includes the impedance detection element 54. At S1, the input voltage and the input current of the positive bias adjustment unit 2 are detected in real time through the impedance detection element 54. At S2, the input impedance is calculated according to the input voltage and the input current, and the calculated input impedance is the current impedance. Whether the current impedance is equal to the preset impedance is determined. If equal, the method proceeds to S1. If not equal, the method proceeds to S3. At S3, according to the current impedance and the preset impedance, the positive bias voltage adjustment unit 2 is controlled to adjust the bias voltage of the base 1 until the current impedance is equal to the preset impedance.

At S3, the difference between the current impedance and the preset impedance is calculated, and the positive bias voltage adjustment unit 2 is controlled to adjust the bias voltage of the base 1 according to the difference until the current impedance is equal to the preset impedance.

By detecting the current bias voltage or the current impedance of the base 1 in real time at S1, the bias voltage of the base can be adjusted in real time during the process, such that the process requirements can be satisfied and process consistency can be ensured for different process chambers.

The base bias adjustment method provided in this embodiment can achieve automatic control of the base bias adjustment.

Figure 9:
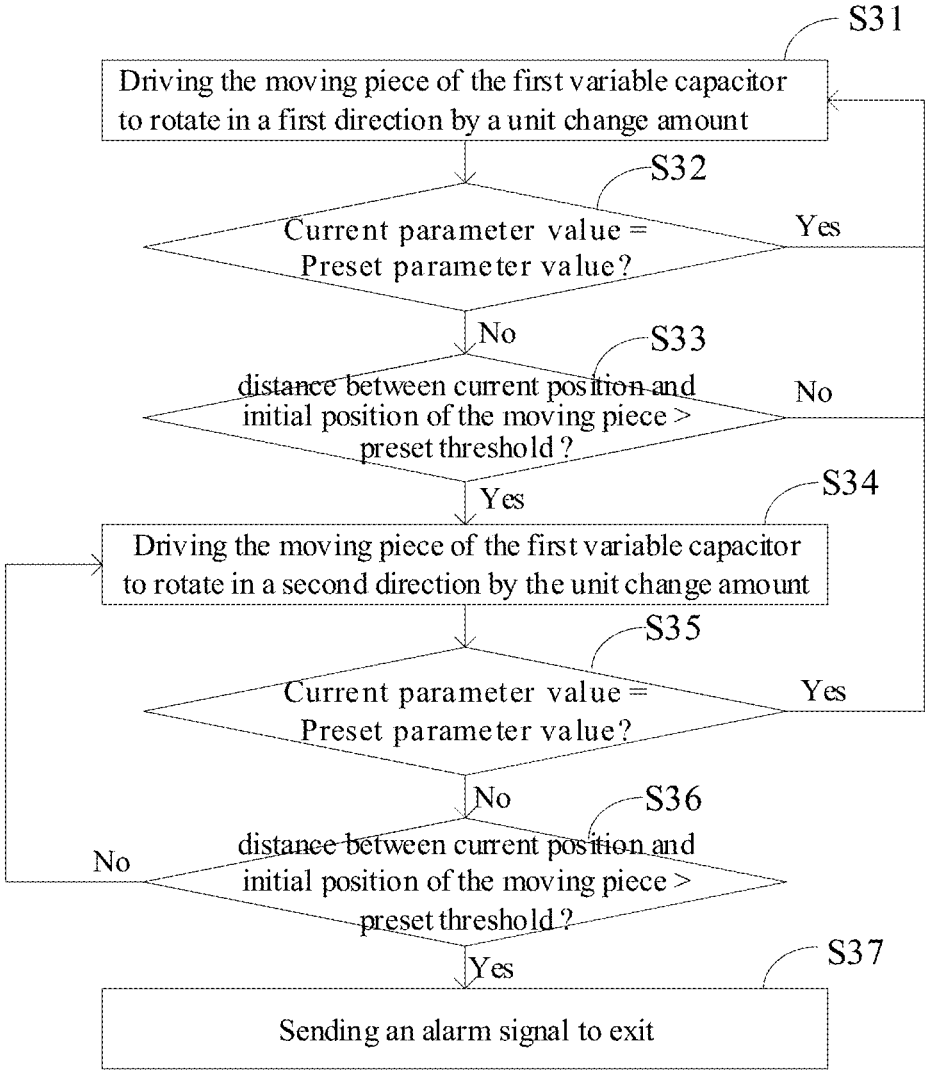
FIG. 9 is a flowchart of step S3 in FIG. 8.

In some embodiments, as shown in FIG. 5, FIG. 7, and FIG. 9, S3 further includes the following processes.

At S31, the moving piece of the first variable capacitor 211 is driven to rotate in a first direction by a unit change amount. The unit change amount is an angle of each rotation of the moving piece of the first variable capacitor 211, that is, the angle change amount.

In some embodiments, as shown in FIG. 5, the capacitance value of the first variable capacitor 211 can be adjusted by the motor 52 driving the rotor of the first variable capacitor 211 to rotate.

At S32, whether the current parameter value is equal to the preset parameter value is determined. If equal, the method proceeds to S1. If not equal, the method proceeds to S33.

In some embodiments, if the parameter acquisition unit includes the voltage detection element 51 shown in FIG. 5, then the current parameter value is the current bias voltage, and the preset parameter value is the preset bias voltage. If the parameter acquisition unit includes the impedance detection element 54 shown in FIG. 7, then the current parameter value is the current impedance, and the preset parameter value is the preset impedance.

At S33, whether a distance (for example, angle change) between a current position and an initial position of the moving piece of the first variable capacitor 211 exceeds a preset threshold is determined. If yes, the method proceeds to S34. If no, the method proceeds to S31.

In some embodiments, the preset threshold is, for example, 5% of the angle value corresponding to the initial position of the moving piece of the first variable capacitor 211.

At S34, the moving piece of the first variable capacitor 211 is driven to rotate in a second direction by the unit change amount. The second direction is opposite to the first direction.

At S35, whether the current parameter value is equal to the preset parameter value is determined. If equal, the method proceeds to S1. If not equal, the method proceeds to S36.

At S36, whether the distance between the current position and the initial position of the moving piece of the first variable capacitor 211 exceeds the preset threshold is determined. If yes, the method proceeds to S37. If no, the method proceeds to S34.

At S37, an alarm signal is sent to stop the process.

Further, in the technical solutions of the base bias adjustment apparatus and method and the semiconductor process device provided by the present disclosure, the second terminal of the positive bias adjustment unit is electrically connected to the base, and the second terminal of the negative bias adjustment unit is electrically connected to the base through the anti-interference unit. By using the anti-interference unit to suppress the current from the circuit between the positive bias adjustment unit and the base from flowing into the circuit between the negative bias adjustment unit and the base, the positive bias adjustment unit and the negative bias adjustment unit always maintain electrical conduction with the base at the same time. At the same time, the base bias adjustment by the positive bias adjustment unit will not be affected by the negative bias adjustment unit. That is, the positive bias adjustment unit and the negative bias adjustment unit are used simultaneously during the process, and mutual interference between the two is avoided. At the same time, because the positive bias adjustment unit can cause the base to have a positive bias and the negative bias adjustment unit can cause the base to have a negative bias, the simultaneous use of the two can make the adjustment range of the base bias voltage larger, thereby expanding the process window to meet different process requirements.

It can be understood that the above embodiments are only exemplary embodiments adopted to illustrate the principles of the present disclosure, but the present disclosure is not limited thereto. For those of ordinary skill in the art, various modifications and improvements can be made without departing from the spirit and essence of the present disclosure, and these modifications and improvements are also regarded as the protection scope of the present disclosure.

What is claimed is:

1. A base bias adjustment apparatus, comprising:
a positive bias adjustment unit;
a negative bias adjustment unit; and
an anti-interference unit;
wherein:
    a first terminal of the positive bias adjustment unit is grounded, and a second terminal of the positive bias adjustment unit is electrically connected to a base for adjusting a bias voltage of the base to have a positive bias voltage at the base;
    a first terminal of the negative bias adjustment unit is grounded, and a second terminal of the negative bias adjustment unit is electrically connected to the base through the anti-interference unit for adjusting the bias voltage of the base to have a negative bias voltage at the base; and
    the anti-interference unit is electrically connected between the negative bias adjustment unit and the base for suppressing a current from a circuit between the positive bias adjustment unit and the base from flowing into a circuit between the negative bias adjustment unit and the base, thereby facilitating simultaneous operation of the positive bias adjustment unit and the negative bias adjustment unit in a process.

2. The base bias adjustment apparatus according to claim 1, wherein:
the positive bias adjustment unit includes an impedance variable circuit;
one terminal of the impedance variable circuit is electrically connected to the base, and the other terminal of the impedance variable circuit is grounded; and
the impedance variable circuit is used to adjust the bias voltage of the base by adjusting an impedance of the impedance variable circuit.

3. The base bias adjustment apparatus according to claim 2, wherein:
the impedance variable circuit includes at least one first variable capacitor, at least one variable inductor, or at least one first variable capacitor and at least one variable inductor that are electrically connected, an electrical connection between the at least one first variable capacitor and the at least one variable inductor including a parallel connection, a series connection, or a mixed connection.

4. The base bias adjustment apparatus according to claim 1, wherein the anti-interference unit includes a band stop filter or a digital filter.

5. The base bias adjustment apparatus according to claim 1, wherein the negative bias adjustment unit includes a radio frequency (RF) power supply and a matching circuit between the RF power supply and the base.

6. The base bias adjustment apparatus according to claim 5, wherein:
the matching circuit includes a first branch and a second branch, wherein one terminal of the first branch is electrically connected to an output terminal of the RF power supply, the other terminal of the first branch is grounded, and the first branch includes a second variable capacitor; and two terminals of the second branch are electrically connected to the output terminal of the RF power supply and the base respectively, the second branch includes a third variable capacitor, and the anti-interference unit is electrically connected to the second branch.

7. The base bias adjustment apparatus according to claim 5, wherein:

the matching circuit includes a first branch, a second branch, a third branch, and a fourth branch, wherein one terminal of the first branch is electrically connected to an output terminal of the RF power supply, the other terminal of the first branch is grounded, and the first branch includes a second variable capacitor;

two terminals of the second branch are electrically connected to the output terminal of the RF power supply and one terminal of the fourth branch respectively, and the second branch includes a fixed capacitor;

one terminal of the third branch is electrically connected to the one terminal of the fourth branch, the other terminal of the third branch is grounded, and the third branch includes a third variable capacitor; and the other terminal of the fourth branch is electrically connected to the base through the anti-interference unit.

8. The base bias adjustment apparatus according to claim 1, further comprising a parameter acquisition unit and a control unit, wherein:

the parameter acquisition unit is used to acquire a current parameter value related to an impedance of the positive bias adjustment unit in real time, and send it to the control unit; and according to the current parameter value and a preset parameter value, the control unit is used to control the positive bias adjustment unit to adjust a bias voltage of the base until the current parameter value is equal to the preset parameter value.

9. The base bias adjustment apparatus according to claim 8, wherein:

the parameter acquisition unit includes a voltage detection unit for detecting a current bias voltage of the base in real time and sending it to the control unit; and according to the current bias voltage and a preset bias voltage, the control unit is used to control the positive bias adjustment unit to adjust the bias voltage of the base until the current bias voltage is equal to the preset bias voltage.

10. The base bias adjustment apparatus according to claim 8, wherein:

the parameter acquisition unit includes an impedance detection unit for detecting an input voltage and an input current of the positive bias adjustment unit in real time and sending it to the control unit; and according to the input voltage and input current, the control unit is used to calculate an input impedance, and according to the input impedance and a preset impedance, the control unit is used to control the positive bias adjustment unit to adjust the bias voltage of the base until the input impedance is equal to the preset impedance.

11. A semiconductor process device comprising a reaction chamber, a base provided in the reaction chamber, and a target provided on top of the reaction chamber, wherein the semiconductor process device further includes a base bias adjustment apparatus comprising a positive bias adjustment unit;

a negative bias adjustment unit; and an anti-interference unit;

wherein:

a first terminal of the positive bias adjustment unit is grounded, and a second terminal of the positive bias adjustment unit is electrically connected to a base for adjusting a bias voltage of the base to have a positive bias voltage at the base;

a first terminal of the negative bias adjustment unit is grounded, and a second terminal of the negative bias adjustment unit is electrically connected to the base through the anti-interference unit for adjusting the bias voltage of the base to have a negative bias voltage at the base; and the anti-interference unit is electrically connected between the negative bias adjustment unit and the base for suppressing a current from a circuit between the positive bias adjustment unit and the base from flowing into a circuit between the negative bias adjustment unit and the base, thereby facilitating simultaneous operation of the positive bias adjustment unit and the negative bias adjustment unit in a process.

\* \* \* \* \*